(12) United States Patent
Cheng et al.

(10) Patent No.: US 11,271,000 B2
(45) Date of Patent: Mar. 8, 2022

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou (CN)

(72) Inventors: Bo-Ruei Cheng, Kaohsiung (TW); Li-Wei Feng, Kaohsiung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/180,010

(22) Filed: Nov. 5, 2018

(65) Prior Publication Data

US 2020/0111794 A1   Apr. 9, 2020

(30) Foreign Application Priority Data

Oct. 9, 2018   (CN) .......................... 201811172593.4

(51) Int. Cl.
*H01L 27/108*     (2006.01)
*H01L 29/06*      (2006.01)
*H01L 21/762*     (2006.01)
*H01L 21/02*      (2006.01)

(52) U.S. Cl.
CPC .. *H01L 27/10829* (2013.01); *H01L 21/02238* (2013.01); *H01L 21/76227* (2013.01); *H01L 27/1087* (2013.01); *H01L 29/0649* (2013.01)

(58) Field of Classification Search
CPC ......... H01L 21/76227; H01L 21/02238; H01L 21/76224; H01L 21/76229–76235; H01L 27/10829; H01L 27/1087
See application file for complete search history.

(56) References Cited

U.S. PATENT DOCUMENTS

| | | | |
|---|---|---|---|
| 6,214,696 B1* | 4/2001 | Wu | H01L 21/76227 257/E21.547 |
| 6,358,785 B1* | 3/2002 | Chittipeddi | H01L 21/76227 257/E21.547 |
| 2004/0029353 A1* | 2/2004 | Zheng | H01L 21/76232 438/424 |
| 2005/0186755 A1* | 8/2005 | Smythe, III | H01L 21/76224 438/424 |

OTHER PUBLICATIONS

Chen, Title of Invention: Method for Fabricating Semiconductor Device, U.S. Appl. No. 15/943,717, filed Apr. 3, 2018.

* cited by examiner

*Primary Examiner* — Amar Movva
(74) *Attorney, Agent, or Firm* — Winston Hsu

(57) ABSTRACT

A method for fabricating semiconductor device includes the steps of: forming a trench in a substrate; forming a first oxide layer in the trench; forming a silicon layer on the first oxide layer; performing an oxidation process to transform the silicon layer into a second oxide layer; and planarizing the second oxide layer and the first oxide layer to form a shallow trench isolation (STI).

9 Claims, 4 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a trench in a substrate; forming a first oxide layer in the trench; forming a silicon layer on the first oxide layer; performing an oxidation process to transform the silicon layer into a second oxide layer; and planarizing the second oxide layer and the first oxide layer to form a shallow trench isolation (STI).

According to an embodiment of the present invention, the silicon layer is formed on the first oxide layer without filling the trench completely.

According to an embodiment of the present invention, the silicon layer is transformed into the second oxide layer to fill the trench completely.

According to an embodiment of the present invention, anatomic layer deposition (ALD) process is performed to form the first oxide layer.

According to an embodiment of the present invention, the oxidation process comprises an in-situ steam generation (ISSG) process.

According to an embodiment of the present invention, a thickness of the silicon layer is less than a thickness of the first oxide layer.

According to an embodiment of the present invention, a thickness of the second oxide layer is greater than a thickness of the silicon layer.

According to an embodiment of the present invention, the silicon layer comprises an amorphous silicon layer.

According to an embodiment of the present invention, the first oxide layer and the second oxide layer comprise silicon oxide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
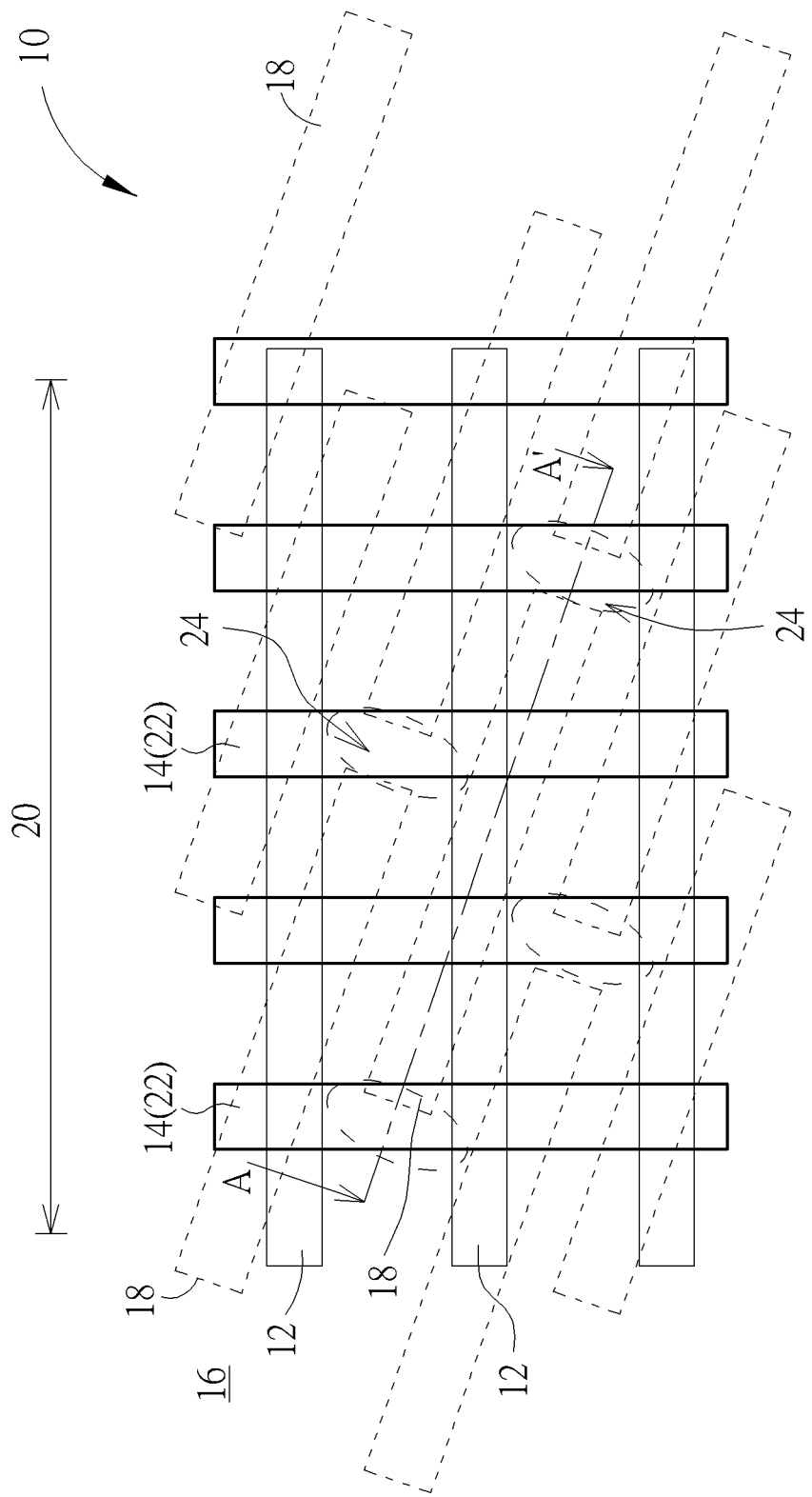
FIG. 1 illustrates a top-view of a DRAM device according to an embodiment of the present invention.

Referring to FIGS. 1-6, FIGS. 1-6 illustrate a method for fabricating a DRAM device according to an embodiment of the present invention, in which FIG. 1 illustrates a top-view of a DRAM device according to an embodiment of the present invention and FIGS. 2-6 illustrate cross-sectional views for fabricating the DRAM device along the sectional line AA'. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction such as Y-direction, in which the second direction crosses the first direction at an angle less than 90 degrees.

The bit lines 12 on the other hand are disposed on the substrate 16 parallel to each other and extending along a third direction such as X-direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
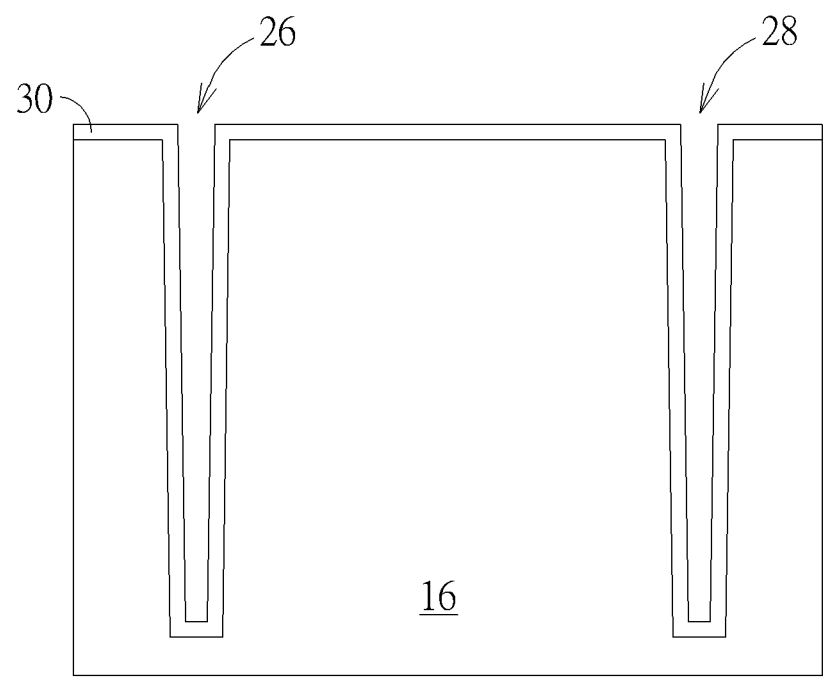
FIGS. 2-6 illustrate cross-sectional views for fabricating the DRAM device along the sectional line AA'.

The fabrication of STI or isolation structures before the formation of word lines 14 (or also referred to as buried word lines) is explained below. As shown in FIG. 2, at least a trench such as a trench 26 and another trench 28 are formed in the substrate 16 on the memory region 20, and an atomic layer deposition (ALD) process or chemical vapor deposition (CVD) process is conducted to form a first oxide layer 30 on the surface of the substrate 16 and into the trenches 26, 28 without filling the trenches 26, 28 completely. In this embodiment, the first oxide layer 30 is preferably made of silicon oxide and the thickness of the first oxide layer 30 is preferably between 50 Angstroms to 90 Angstroms or most preferably at 70 Angstroms.

Figure 3:
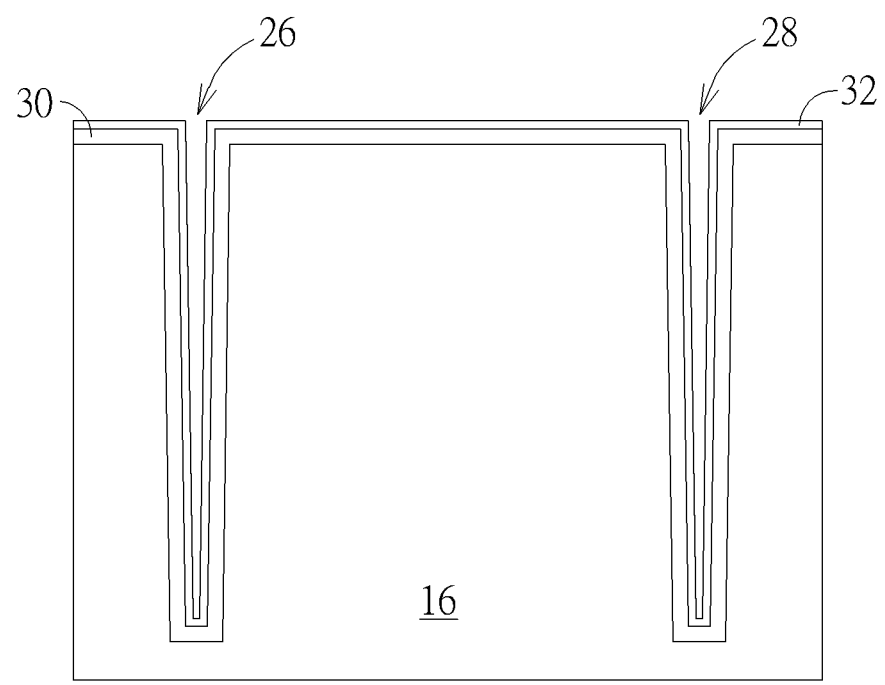

Next, as shown in FIG. 3, a silicon layer 32 is formed on the first oxide layer 30, in which the silicon layer 32 is disposed on the surface of the first oxide layer 30 and also not filling the trenches 26, 28 completely. In this embodiment, the silicon layer 32 preferably includes an amorphous silicon layer and the thickness of the silicon layer 32 is slightly less than the thickness of the first oxide layer 30, in which the thickness of the silicon layer 32 at this stage is preferably between 20 Angstroms to 40 Angstroms or most preferably at 30 Angstroms.

Figure 4:
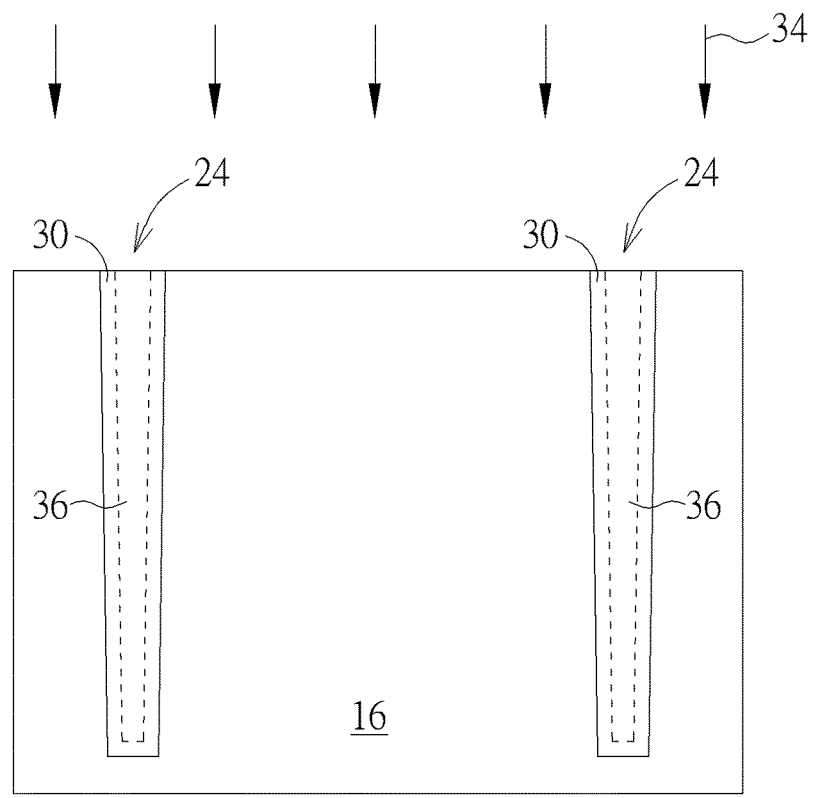

Next, as shown in FIG. 4, an oxidation process 34 is conducted to transform the silicon layer 32 into a second oxide layer 36. In this embodiment, the oxidation process 34 preferably includes an in-situ steam generation (ISSG) process and the approach of employing ISSG process to transform the silicon layer 32 into the second oxide layer 36 preferably includes reacting all of the silicon layer 32 with oxygen gas to transform into the second oxide layer 36. In other words, none of the silicon layer 32 would remain after the ISSG process 34 is completed and the newly formed second oxide layer 36 would be disposed on the surface of the first oxide layer 30 to fill the trenches 26, 28 completely. In this embodiment, the second oxide layer 36 and the first oxide layer 30 are preferably made of same material such as but not limited to for example silicon oxide. Next, a planarizing process such as chemical mechanical polishing (CMP) process and/or etching process is conducted to remove part of the second oxide layer 36 and part of the first oxide layer 30 to form STI 24 in the trenches 26, 28, in which the top surface of the STI 24 is preferably even with the top surface of the substrate 16.

Figure 5:
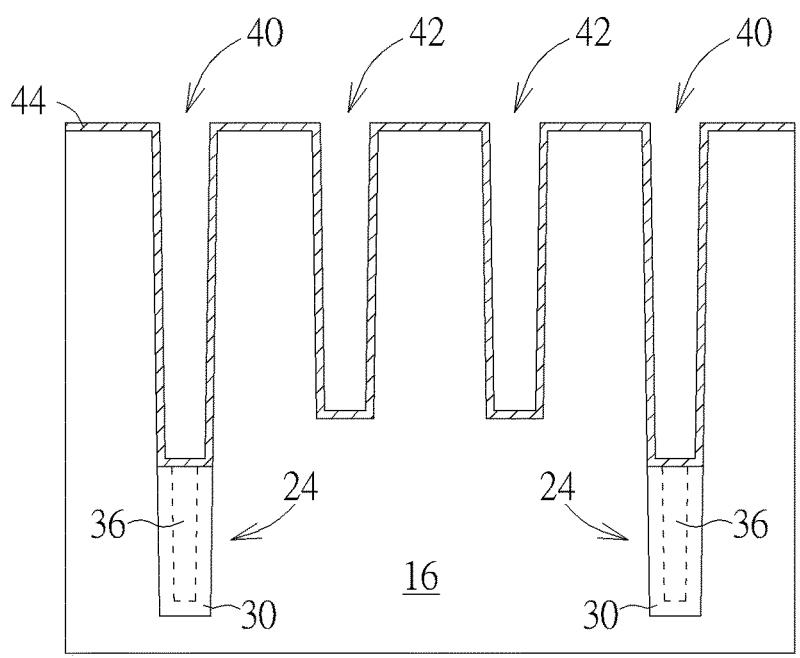

Next, fabrication process for forming word lines (or also referred to as buried word lines) could be conducted thereafter. For instance, as shown in FIG. 5, an etching process could be conducted to remove part of the STI 24 and part of the substrate 16 between or adjacent to the STI 24 to form a first trench 40 and second trench 42, in which the STI 24 is beneath the bottom of the first trench 40 and the top surface of the STI 24 is slightly lower than the bottom surface of the second trench 42. Next, an ALD process, a CVD process, or an ISSG could be conducted depending on the demand of the process to form a gate dielectric layer 44 made of silicon oxide in the first trench 40 and the second trench 42.

Figure 6:
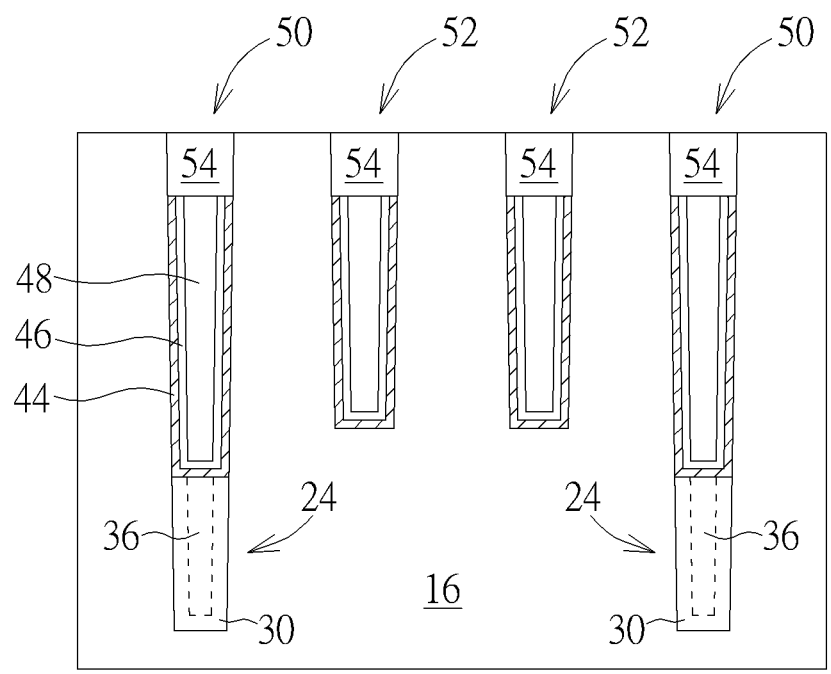

Next, as shown in FIG. 6, a barrier layer 46 and a conductive layer 48 are sequentially formed in the first trench 40 and second trench 42 to fill the trenches 40, 42 completely, and an etching back process is conducted to remove part of the conductive layer 48, part of the barrier layer 46, and part of the gate dielectric layer 44 so that the top surface of the remaining conductive layer 48, barrier layer 46, and gate dielectric layer 44 is slightly lower than the top surface of the substrate 16. This forms first gate structures 50 in the first trenches 40 and second gate structures 52 in the second trenches 42, in which the first gate structures 50 and second gate structures 52 essentially become the word lines 14 shown in FIG. 1. Next, a hard mask 54 is formed on each of the first gate structures 50 and second gate structures 52, in which the top surface of the hard masks 54 is even with the top surface of the substrate 16.

In this embodiment, the barrier layer 46 preferably includes a work function metal layer which could be a n-type work function metal layer or p-type work function metal layer depending on the demand of the process or product. In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto. The conductive layer 48 could be made of low resistance material including but not limited to for example Cu, Al, W, TiAl, CoWP, or combination thereof and the hard masks 54 are preferably made of dielectric material such as silicon nitride.

Next, an ion implantation process could be conducted depending on the demand of the process to form a doped region (not shown) such as lightly doped drain or source/drain region in the substrate 16 adjacent to two sides of the first gate structure 50 or second gate structure 52. Next, a contact plug process could be conducted to form word line contacts adjacent to two sides of the second gate structures 52 electrically connecting the source/drain region and bit lines formed thereafter and storage node contacts electrically connecting the source/drain region and capacitors fabricated in the later process.

Overall, the present invention first form a trench in the substrate and a first oxide layer in the trench before the buried word line (BWL) of a DRAM device is fabricated, forms a silicon layer or more specifically an amorphous silicon layer on the surface of the first oxide layer, and then conducts an ISSG process to transform all of the amorphous silicon layer into a second oxide layer, and then planarize part of the second oxide layer and part of the first oxide layer to form a STI. According to a preferred embodiment of the present invention, this approach not only reduces the chance of creating seams in the STI made of silicon oxide, but also prevents over consumption of silicon substrate when the ISSG process is conducted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for fabricating semiconductor device, comprising:
   forming a trench in a substrate;
   forming a first oxide layer in the trench, wherein the first oxide layer is a single-layered structure made of silicon oxide;
   forming a silicon layer on and directly contacting the first oxide layer without filling the trench completely, wherein a thickness of the silicon layer is less than a thickness of the first oxide layer;
   performing an oxidation process to transform the silicon layer into a second oxide layer for filling the trench completely, wherein a maximum width of the second oxide layer in the trench is greater than a maximum width of the silicon layer in the trench; and planarizing the second oxide layer and the first oxide layer to form a shallow trench isolation (STI).

2. The method of claim 1, further comprising forming the silicon layer on the first oxide layer without filling the trench completely.

3. The method of claim 1, further comprising transforming the silicon layer into the second oxide layer to fill the trench completely.

4. The method of claim 1, further comprising performing an atomic layer deposition (ALD) process to form the first oxide layer.

5. The method of claim 1, wherein the oxidation process comprises an in-situ steam generation (ISSG) process.

6. The method of claim 1, wherein a thickness of the silicon layer is less than a thickness of the first oxide layer.

7. The method of claim 1, wherein a thickness of the second oxide layer is greater than a thickness of the silicon layer.

8. The method of claim 1, wherein the silicon layer comprises an amorphous silicon layer.

9. The method of claim 1, wherein the first oxide layer and the second oxide layer comprise silicon oxide.

\* \* \* \* \*